May 6, 1969 B. R. CZORNY ET AL 3,443,175

PN-JUNCTION SEMICONDUCTOR WITH POLYCRYSTALLINE LAYER ON ONE REGION

Filed March 22, 1967

INVENTORS

BOHDAN R. CZORNY &

ERIC F. CAVE

BY Abraham Sherman

ATTORNEY

United States Patent Office 3,443,175

Patented May 6, 1969

3,443,175

PN-JUNCTION SEMICONDUCTOR WITH POLYCRYSTALLINE LAYER ON ONE REGION

Bohdan R. Czorny, Bound Brook, and Eric F. Cave, Somerville, N.J., assignors to Radio Corporation of America, a corporation of Delaware Filed Mar. 22, 1967, Ser. No. 625,061
Int. Cl. H01l *11/02*
U.S. Cl. 317—235 8 Claims

ABSTRACT OF THE DISCLOSURE

A junction device comprising a semiconductive body which includes at least two regions of different conductivity types, a PN junction between the two regions, and a layer of polycrystalline semiconductive material on one of the two regions. The polycrystalline layer is of the same conductivity type as the region of the body which underlies the layer.

BACKGROUND OF THE INVENTION

*Field of the invention*

This invention relates to improved semiconductor devices, such as diodes, transistors, integrated circuit devices and the like.

*Description of the prior art*

One of the important electrical parameters of a semiconductor junction device is the reverse breakdown voltage of the junction. In many semiconductor junction devices, it is desirable that the PN junction be capable of withtsanding a relatively high reverse voltage, preferably at least 200 volts. Although various techniques are known in the art for fabricating semiconductor devices containing a PN junction which exhibits a high reverse breakdown voltage, devices thus fabricated exhibit a reverse breakdown voltage which is substantially less than that which is suggested as possible by present physical theory. Further improvement in the reverse breakdown voltage of PN-junction semiconductor devices is desirable.

SUMMARY OF THE INVENTION

A semiconductor junction device is provided comprising a crystalline semiconductor body of one type conductivity; a zone of the other type conductivity immediately adjacent one face of the body; a PN junction between the zone and the remainder of the body; and a layer of polycrystalline semiconductive material of the other type conductivity on the zone. The polycrystalline layer improves the reverse breakdown voltage of the PN junction.

DESCRIPTION OF THE PREFERRED EMBODIMENTS

*Example 1*

Figure 1:
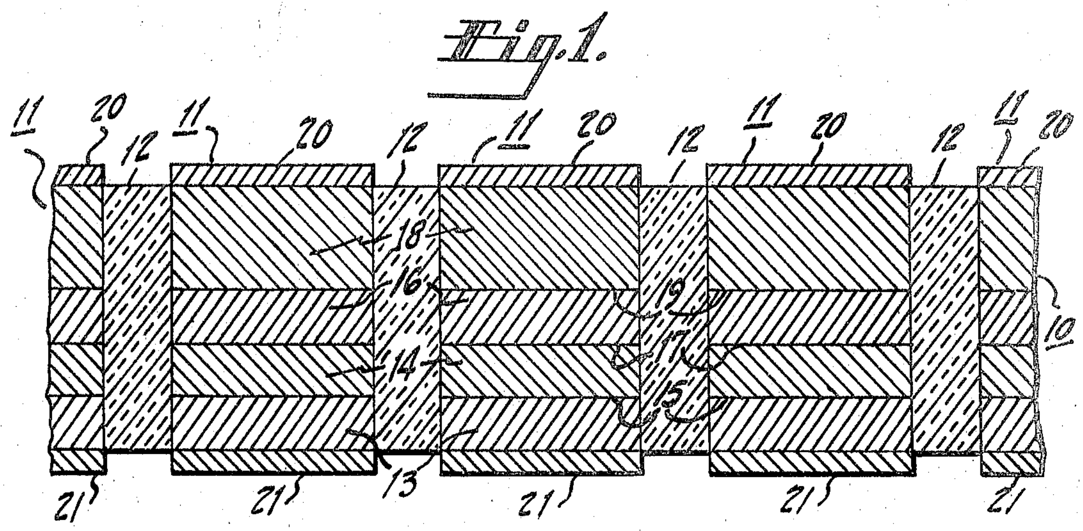
FIGURE 1 is a sectional view of a portion of a composite body including a plurality of semiconductor diodes according to one embodiment of the invention; and, FIGURE 2 is a sectional view of a transistor according to another embodiment.

A composite structure 10 (FIGURE 1) is formed consisting of a plurality of isolated semiconductive devices 11 that are united by an insulating matrix 12, which suitably consists of glass. The composite structure 10 may be fabricated by hot pressing together a glass plate and a suitably prepared semiconductive body, as described in detail in U.S. Patent 3,300,832, issued to Eric F. Cave on Jan. 31, 1967.

Each semiconductive device 11 comprises a semiconductive base or substrate 13. The precise size, shape, conductivity type and composition of the semiconductive substrate 13 is not critical in the practice of the invention. The substrate 13 may be either P-type or N-type, and may be either polycrystalline or monocrystalline, although monocrystalline material is preferred for obtaining the highest reverse breakdown voltage. The substrate 13 may consist of either elemental semiconductors such as germanium or silicon, or alloyed semiconductors such as silicon-germanium alloys, or compound semiconductors such as the nitrides, phosphides, arsenides or antimonides of boron, aluminum, gallium and indium. In this example, each substrate 13 is disc-shaped, about 30 to 50 mils in diameter, and consists of monocrystalline N-conductivity type silicon having a low electrical resistivity (about .01 ohm-cm.).

A first epitaxial layer 14 of monocrystalline silicon of the same type conductivity as the substrate 13 is deposited on one face of the substrate 13. The first epitaxial layer 14 is of N-type conductivity in this example, is about 1 mil thick, and has a resistivity of about 20 to 25 ohm-cm. The boundary or interface 15 between the low resistivity semiconductive substrate 13 and the high resistivity epitaxial layer 14 may be described as a high-low junction.

A second epitaxial layer 16 of crystalline semiconductive material is deposited on the first epitaxial layer 14. The second epitaxial layer 16 is of conductivity type opposite to that of semiconductive substrate 13 and that of the first epitaxial layer 14. In this embodiment, the second epitaxial layer 16 consists of P-type conductivity monocrystalline silicon, is about 1 mil thick, and has a resistivity of about 35 to 50 ohm-cm. The boundary or interface 17 between the second epitaxial layer 16 and the first epitaxial layer 14 constitutes a rectifying PN junction.

A layer 18 of polycrystalline semiconductive material is deposited on the second epitaxial layer 16. Layer 18 is of the same type conductivity as the second epitaxial layer 16, but is preferably of lower resistivity. Advantageously, the resistivity of polycrystalline layer 18 is less than that of the adjacent epitaxial semiconductive layer 16 by at least two orders of magnitude, i.e., not greater than $\frac{1}{100}$ times the resistivity of the layer 16. The term "order of magnitude" is meant to signify a factor of ten. In this example, layer 18 consists of P-type polycrystalline silicon having a resistivity of about .008 cm., and a thickness of about 5 to 7 mils. The boundary or interface 19 between the high resistivity P-type epitaxial layer 16 and the low resistivity P-type polycrystalline layer 18 may be described as a high-low junction. The deposition of the various semiconductive layers is accomplished by standard methods of the art, such as those described in the RCA Review, vol. XXIV, No. 4, December 1963, and need not be described here. By depositing the layer 18 at lower temperatures or at more rapid rates than those required for monocrystalline layers, the layer 18 is made polycrystalline.

If a fast-acting diode is desired, a substance which is a lifetime killer in the particular semiconductor employed may be diffused into the substrate 13 prior to the formation of the completed composite body 10. When the substrate 13 consists of silicon as in this example, a thin film of gold (not shown) may be deposited on one face of the substrate 13, and the substrate then heated to about 950° C. to diffuse the gold into the substrate 13. The diffused gold reduces the lifetime of minority charge carriers in silicon.

A metallic coating 20, which may for example consist of electroless nickel, is deposited on each polycrystalline layer 18. A similar metallic coating 21, which may also be an electroless nickel film, is deposited on the exposed face of each substrate 13. The metallic coatings 20 and 21 serve as the device contacts or electrodes. The electrode 20 is everywhere spaced from the epitaxial layer or zone 16, i.e., does not contact the zone 16.

The remaining steps of separating the individual diodes, and attaching electrical lead wires to the metallic contacts thereon, are accomplished by standard methods of the art, and need not be described here. If desired, groups consisting of a plurality of such diodes are cut out of the composite body 10, and the separate diodes in each group are connected in series by standard methods.

Ordinarily, diodes made like those described above but without the polycrystalline layer 18 exhibit a reverse breakdown voltage of 400 volts, at a current of 10 microamperes. Moreover, the I–V curves are rounded. In contrast, when a layer 18 of polycrystalline semiconductor material is utilized as described in this embodiment, the devices consistently exhibit a breakdown voltage of about 900 volts at 10 microamperes. Moreover, the "knee" of the I–V curves is sharper.

In this example, a polycrystalline silicon layer is deposited on an adjacent layer of monocrystalline silicon. Alternatively, a layer of polycrystalline germanium may be deposited on monocrystalline silicon. Similarly, polycrystalline silicon may be deposited on monocrystalline germanium. The conductivity types of the various regions described in the device may be reversed.

*Example II*

In the previous embodiment, the PN junction was formed adjacent to an epitaxial layer of semiconductive material. In the present embodiment, the PN junction is formed adjacent to a diffused layer of semiconductive material.

Figure 2:
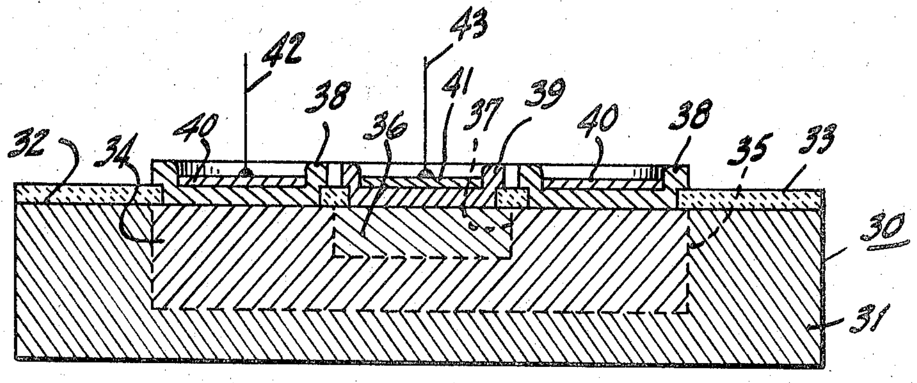

A transistor 30 (FIGURE 2) is formed comprising a crystalline semiconductive body 31 of one conductivity type having at least one face 32. In this example, the body 31 consists of monocrystalline silicon, and is of N-type conductivity. An insulating masking layer 33 is deposited on the one face 32 of the semiconductive body 31. the insulating layer 33 may for example consist of silicon oxide deposited by heating the semiconductive body 31 in the vapors of a siloxane compound, as described in U.S. Patent 3,089,793, issued to Jordan et al. on May 14, 1963.

Immediately adjacent the face 32 on the semiconductive body 31 is a diffused region or zone 34 of the other conductivity type. In this example, region 34 is of P-type conductivity, and is formed by diffusing boron oxide into an unmasked portion of the face 32. The boundary or interface 35 between P-type region 34 and the N-type bulk of semiconductive body 31 becomes the base-collector PN junction of the transistor.

Disposed immediately adjacent to the face 32 and within the P-type base region 34 is a diffused emitter region or zone 36 of the one conductivity type, that is, of the same type conductivity as the bulk of semiconductive body 31. The diffused region 36 is of N-type conductivity in this example, and is formed by diffusing phosphorus pentoxide into an unmasked portion of the face 32. The boundary or interface 37 between the N-type emitter region 36 and the P type base region 34 serves as the emitter-base PN junction of the device.

An annular layer 38 of polycrystalline semiconductive material is deposited on an unmasked portion of the face 32 in direct contact with the base region 34. The polycrystalline layer 38 is of the same type conductivity as the base region 34, i.e., P-type in this example. Preferably, the resistivity of the polycrystalline layer 38 is less than 0.01 ohm-cm.

A layer 39 of polycrystalline semiconductive material is deposited on an unmasked portion of the face 32 in direct contact with the emitter region 36. The polycrystalline layer 39 is of the same type conductivity as the emitter region 36, i.e., N-type in this example. Preferably, the resistivity of the polycrystalline layer 39 is less than 0.01 ohm-cm. In this example, the polycrystalline layers 38 and 39 both consist of germanium. Alternatively, the polycrystalline layers 38 and 39 may consist of silicon or of two different semiconductive materials. Fabrication of the device is accomplished by standard photolithographic masking and etching techniques known to the art.

To complete the device, an annular first metallic film 40 is deposited on the polycrystalline layer 38, and a second metallic film 41 is deposited on the polycrystalline layer 39. The metallic films 40 and 41 suitably consist of chromium or palladium or aluminum or nickel or the like, and serve as the base and emitter electrodes respectively of the transistor. Electrode 40 is everywhere spaced from the base zone 34, and electrode 41 is everywhere spaced from the emitter zone 36. Electrical lead wires 42 and 43 are attached to the electrodes 40 and 41, respectively.

In the completed transistor 30, the polycrystalline layers 38 and 39 not only improve the electrical characteristics of the base-collector junction 35 and the emitter-base junction 37, but also help to protect these junctions by sealing them from the deleterious effects of moisture and other undesirable environmental contaminants.

The above examples are by way of illustration only, and not by way of limitation. Other semiconductive materials and other conductivity type modifiers may be employed. Devices having three or four PN junctions, such as thyristors, may be similarly fabricated. Various other modifications may be made without departing from the spirit and scope of the invention as set forth in the specification and the appended claims.

We claim:

1. A semiconductor device comprising:
(a) a monocrystalline semiconductive body of one conductivity type having at least one major face;
(b) a zone of the other conductivity type in said body immediately adjacent said one face;
(c) a PN junction between said zone and the bulk of said body;
(d) a polycrystalline semiconductive layer of said other conductivity type on said zone; and,
(e) electrical contacts on said semiconductive body and said polycrystalline layer.

2. A semiconductor device as in claim 1, wherein said polycrystalline layer consists of the same semiconductive material as said semiconductive body.

3. A semiconductor device as in claim 1, wherein the resistivity of said polycrystalline layer is less than the resistivity of said zone by at least two orders of magnitude.

4. A semiconductor device as in claim 1, wherein said electrical contact on said polycrystalline layer is everywhere spaced from said zone.

5. A semiconductor device comprising:
(a) a monocrystalline silicon body of one conductivity type having at least one face;
(b) a first epitaxial layer of monocrystalline silicon of said one conductivity type on said one body face;
(c) a second monocrystalline silicon epitaxial layer of the other conductivity type on said first epitaxial layer;
(d) a PN junction between said first and second epitaxial layers;
(e) a layer of polycrystalline semiconductive material of said other conductivity type on said second epitaxial layer; and,
(f) electrical contacts to said semiconductive body and said polycrystalline layer.

6. A semiconductor device as in claim 4, wherein said polycrystalline layer consists of silicon.

7. A semiconductor device as in claim 4, wherein the resistivity of said polycrystalline layer is less than the resistivity of said second epitaxial layer by at least two orders of magnitude.

8. A transistor comprising:

(a) a monocrystalline semiconductive body of one type conductivity having at least one face;

(b) an insulating layer on portions of said one face;

(c) a first region of the other type conductivity in said body immediately adjacent said one face;

(d) a first layer of polycrystalline semiconductive material of said other conductivity type on said first region;

(e) a first PN junction between said first region and the bulk of said body;

(f) a second region of said one type conductivity in said body immediately adjacent said one face and within said first region;

(g) a second layer of polycrystalline semiconductive material of said one type conductivity on said second region;

(h) a second PN junction between said second region and said first region;

(i) a first electrode on said first polycrystalline layer;

(j) a second electrode on said second polycrystalline layer; and, (k) two electrical lead wires attached to said first and second electrodes, respectively.

References Cited

UNITED STATES PATENTS

| | | | |
|---|---|---|---|
| 2,791,758 | 5/1957 | Looney | 317—235 X |
| 3,017,520 | 1/1962 | Maupin | 317—235 X |
| 3,189,973 | 6/1965 | Edwards et al. | 317—235 X |
| 3,335,038 | 8/1967 | Doo | 317—234 X |
| 3,370,980 | 2/1968 | Anderson | 317—234 X |

JAMES D. KALLAM, *Primary Examiner.*

U.S. Cl. X.R.

317—234